(12) United States Patent  
Onishi

(10) Patent No.: US 7,668,219 B2  
(45) Date of Patent: Feb. 23, 2010

(54) SURFACE EMITTING SEMICONDUCTOR DEVICE

(75) Inventor: Yutaka Onishi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 124 days.

(21) Appl. No.: 11/826,912

(22) Filed: Jul. 19, 2007

(65) Prior Publication Data

US 2008/0019410 A1    Jan. 24, 2008

(30) Foreign Application Priority Data

Jul. 20, 2006    (JP) .................... P2006-198562

(51) Int. Cl.
   *H01S 5/00*    (2006.01)
(52) U.S. Cl. .............. 372/45.011; 372/45.01
(58) Field of Classification Search .......... 372/46.01, 372/96, 45
   See application file for complete search history.

(56) References Cited

U.S. PATENT DOCUMENTS

| 5,724,376 | A | * | 3/1998 | Kish et al. ............ 372/96 |
| 5,778,018 | A | * | 7/1998 | Yoshikawa et al. ...... 372/45.01 |
| 5,877,038 | A | * | 3/1999 | Coldren et al. ......... 438/39 |
| 2002/0031155 | A1 | * | 3/2002 | Tayebati et al. ........ 372/50 |
| 2003/0189963 | A1 | * | 10/2003 | Deppe et al. .......... 372/96 |

FOREIGN PATENT DOCUMENTS

JP    2891133    2/1999

* cited by examiner

*Primary Examiner*—Minsun Harvey  
*Assistant Examiner*—Patrick Stafford  
(74) *Attorney, Agent, or Firm*—Smith, Gambrell & Russell, LLP

(57) ABSTRACT

A surface emitting semiconductor device comprises: a semiconductor region including an active layer; a first DBR having first layers and second layers; and a second DBR. The first and second layers are alternately arranged, and the first layers are made of dielectric material. The first DBR, semiconductor region and second DBR are sequentially arranged along a predetermined axis, and the semiconductor region is provided between the first DBR and the second DBR. The cross section of the first DBR is taken along a reference plane perpendicular to the predetermined axis. The distance between two points on an edge of the cross section takes a first value in a direction of an X-axis of a two-dimensional XY orthogonal coordinate system defined on the reference plane, and the distance between two points on the edge takes a second value in a direction of a Y-axis of the above coordinate system. The first value is different from the second value. The cross section of the second DBR is taken along another reference plane perpendicular to the predetermined axis, and a shape of the cross section of the first DBR is different from a shape of the cross section of the second DBR.

20 Claims, 4 Drawing Sheets

SURFACE EMITTING SEMICONDUCTOR DEVICE

BACKGROUND OF THE INVENTION

1. Field of the Invention

The present invention relates to a surface emitting semiconductor device.

2. Related Background Art

A vertical cavity surface emitting laser (VCSEL) has an active layer provided between an upper DBR and a lower DBR. Patent Publication 1 (Japanese Patent No. 2,891,133) discloses a vertical cavity surface emitting laser which includes an upper DBR of a post structure. The vertical cavity surface emitting laser emits light through the upper DBR on the top, and in the top view, the upper DBR made of III-V compound semiconductor is a rectangle.

SUMMARY OF THE INVENTION

But, the polarization of light from vertical cavity surface emitting lasers cannot be controlled to orient it to a desired direction by merely changing the shape of the upper DBR.

It is an object to provide a vertical cavity surface emitting device that can control the polarization direction of light therefrom to a desired direction.

According to one aspect of the present invention, a surface emitting semiconductor device comprises: a semiconductor region including an active layer; a first distributed Bragg reflector having first layers and second layers; and a second distributed Bragg reflector. The first and second layers are alternately arranged, and the first layers are made of dielectric material. The first distributed Bragg reflector, the semiconductor region and the second distributed Bragg reflector are sequentially arranged along a predetermined axis, and the semiconductor region is provided between the first distributed Bragg reflector and the second distributed Bragg reflector. The cross section of the first distributed Bragg reflector is taken along a reference plane perpendicular to the predetermined axis. The distance between two points on an edge of the cross section takes a first value in a direction of an X-axis of a two-dimensional XY orthogonal coordinate system defined on the reference plane, and the distance between two points on the edge takes a second value in a direction of a Y-axis of the two-dimensional XY orthogonal coordinate system. The first value is different from the second value. The cross section of the second distributed Bragg reflector is taken along another reference plane perpendicular to the predetermined axis, and the shape of the cross section of the first distributed Bragg reflector is different from the shape of the cross section of the second distributed Bragg reflector.

In the surface emitting semiconductor device according to the present invention, the first value is maximum. In the surface emitting semiconductor device according to the present invention, the second value is minimum.

In the surface emitting semiconductor device according to the present invention, the shape of the cross section of the first distributed Bragg reflector is rectangular. Alternatively, in the surface emitting semiconductor device according to the present invention, the shape of the cross section of the first distributed Bragg reflector is elliptic.

In the surface emitting semiconductor device according to the present invention, the active layer has a quantum well structure. Further, in the surface emitting semiconductor device according to the present invention, the second distributed Bragg reflector includes a plurality of semiconductor layers.

In the surface emitting semiconductor device according to the present invention, the semiconductor region has a first surface and a second surface, the first surface is opposite to the second surface, the first surface has a first area and a second area, and the first distributed Bragg reflector is provided on the first area. Further, in the surface emitting semiconductor device according to the present invention, the first distributed Bragg reflector is in contact with the first area.

In the surface emitting semiconductor device according to the present invention, the first distributed Bragg reflector applies tensile stress to the active layer. Alternatively, in the surface emitting semiconductor device according to the present invention, the first distributed Bragg reflector applies compressive stress to the active layer.

In the surface emitting semiconductor device according to the present invention, the semiconductor region includes a current confinement layer provided between the active layer and the first distributed Bragg reflector, the current confinement layer includes a current blocking layer and a filling layer, the current blocking layer has an opening, and the filling layer is provided in the opening. Further, in the surface emitting semiconductor device according to the present invention, the semiconductor region includes a current confinement layer provided between the active layer and the first distributed Bragg reflector, the current confinement layer includes a carrier confinement structure having a tunnel junction.

In the surface emitting semiconductor device according to the present invention, a bottom of the first distributed Bragg reflector is rectangular or elliptic. Further, the surface emitting semiconductor device according to the present invention further comprises a conductive substrate. The semiconductor region has a mesa, the mesa is provided on the conductive substrate, and the mesa includes a contact layer, the active layer and the second distributed Bragg reflector sequentially arranged along the predetermined axis. Furthermore, in the surface emitting semiconductor device according to the present invention, the surface emitting semiconductor device includes a laser diode and the laser diode emits a polarized laser beam.

In the surface emitting semiconductor device according to the present invention, the first and second layers of the first distributed Bragg reflector are made of silicon oxide and amorphous silicon, respectively. Further, in the surface emitting semiconductor device according to the present invention, the first and second layers of the first distributed Bragg reflector are made of $Al_2O_3$ and $TiO_2$, respectively. Furthermore, in the surface emitting semiconductor device according to the present invention, the first and second layers of the first distributed Bragg reflector are made of $Al_2O_3$ and ZnS, respectively.

According to another aspect of the present invention, a surface emitting semiconductor device comprises: a first distributed Bragg reflector having a plurality of dielectric layers; a second distributed Bragg reflector; and a semiconductor active layer provided between the first distributed Bragg reflector and the second distributed Bragg reflector. The cross section of the first distributed Bragg reflector is taken along a reference plane perpendicular to the predetermined axis, and the shape of the cross section of the first distributed Bragg reflector is asymmetrical cross-section geometry by reference to an optical axis of the surface emitting semiconductor device. Further, in the surface emitting semiconductor device according to the present invention, the shape of the cross section of the first distributed Bragg reflector is one of rectangle and ellipse.

BRIEF DESCRIPTION OF THE DRAWINGS

The above objects and other objects, features, and advantages of the present invention will be understood easily from the following detailed description of the preferred embodiments of the present invention with reference to the accompanying drawings.

DETAILED DESCRIPTION OF THE PREFERRED EMBODIMENTS

Referring to the accompanying drawings, embodiments of the present invention will be explained. When possible, parts identical to each other will be referred to with symbols identical to each other.

First Embodiment

Figure 1:
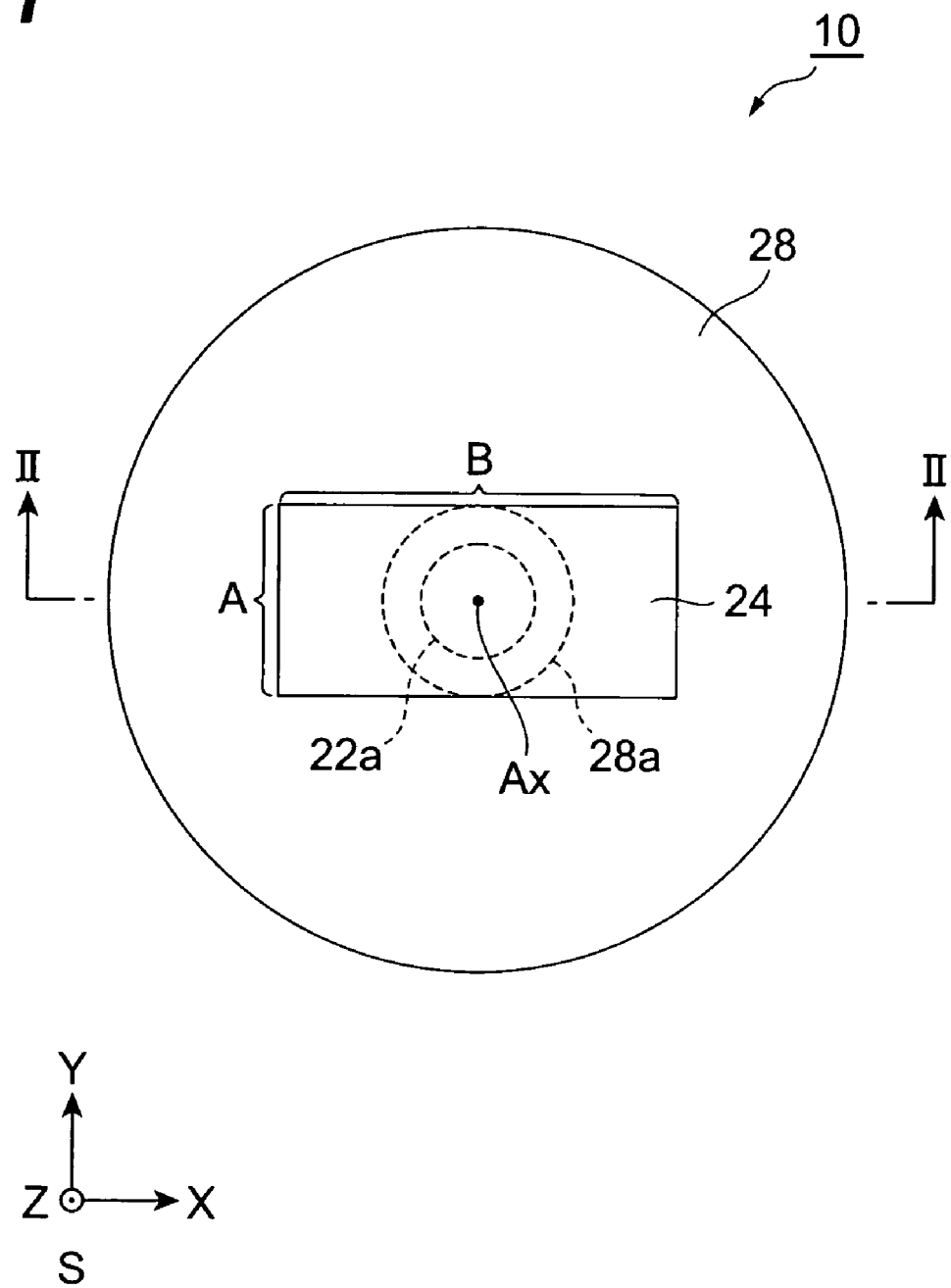
FIG. 1 is a schematic plane view showing a surface emitting semiconductor device according to the embodiment of the present invention.
Figure 2:
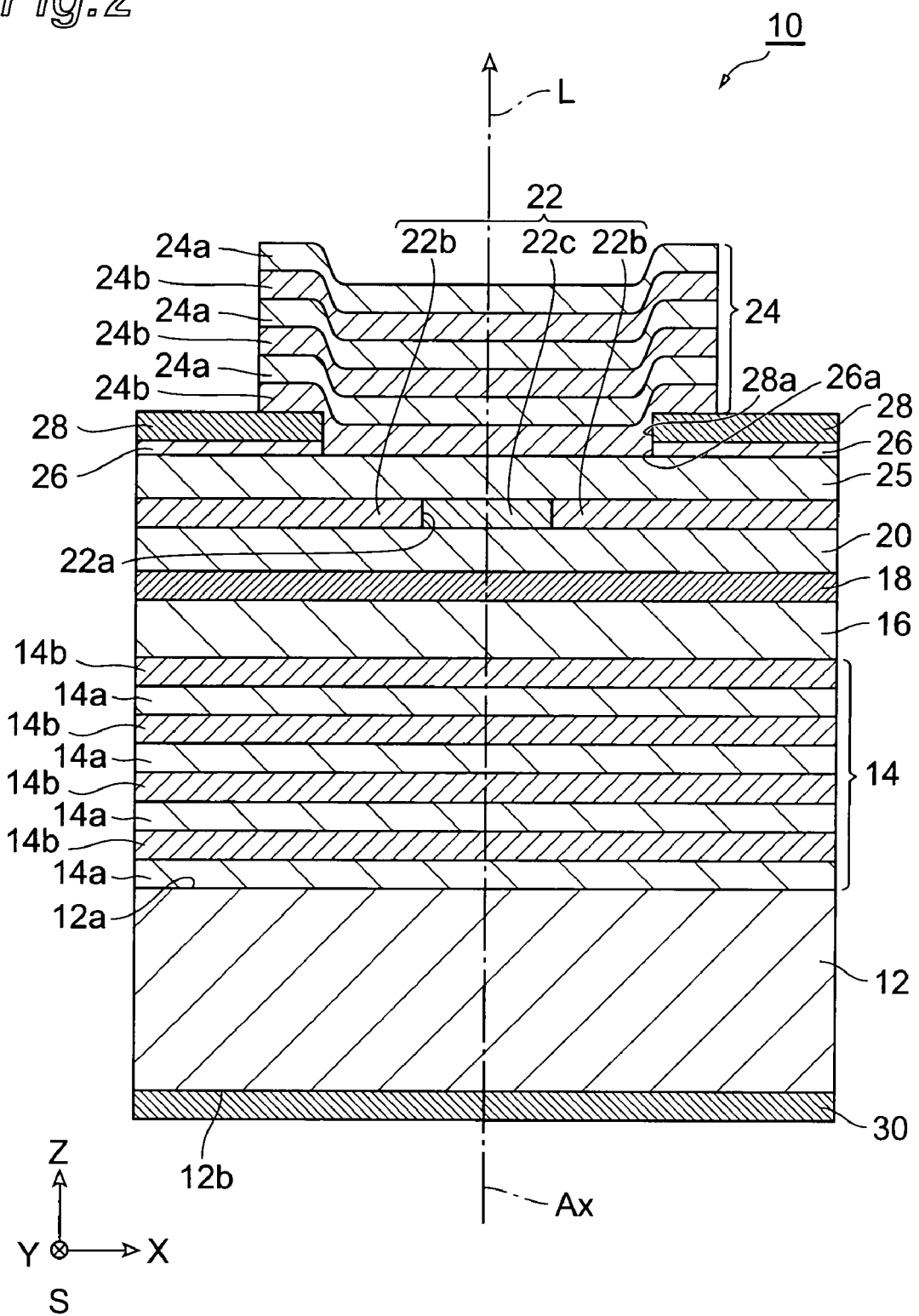
FIG. 2 is a cross sectional view, taken along II-II line in FIG. 1, showing the surface emitting semiconductor device.

FIG. 1 is a schematic plan view showing a surface emitting semiconductor device according to the embodiment. FIG. 2 is a cross sectional view, taken along II-II line in FIG. 1, showing the surface emitting semiconductor device. A surface emitting laser will be described below as an example of surface emitting semiconductor devices. For example, the type of a surface emitting laser 10 in FIGS. 1 and 2 is a VCSEL. XYZ coordinate system S is shown in FIGS. 1 and 2. The surface emitting laser 10 emits light "L" in the z direction. The light "L" propagates along the axis "Ax" that extends in the Z direction, for example.

The surface emitting laser 10 includes a first distributed Bragg reflector (DBR) 24, a second DBR 14, an active layer 18 provided between the first DBR 24 and the second DBR 14. The DBR 24 and DBR 14 constitute an optical cavity. The DBR 24, the active layer 18 and the DBR 14 are arranged in the Z direction.

The DBR 24 includes a reflective multiple film having dielectric layers 24a and layers 24b, and the dielectric layers 24a and the layers 24b are alternately arranged in the z direction. The dielectric layers 24a are made of insulating material, such as silicon oxide ($SiO_2$), titanium oxide ($TiO_2$), aluminum oxide ($Al_2O_3$), amorphous silicon (a-Si), ZnS and the like. The layers 24b are made of semiconductor material, such as amorphous silicon (a-Si) and ZnS, and insulating material, such as silicon oxide, titanium oxide, aluminum oxide and the like. Preferable material combinations of the dielectric layers 24a and 24b are listed in the following notation (material of layers 24a/material of layers 24b): (amorphous silicon/silicon oxide); (titanium oxide/aluminum oxide); (ZnS/aluminum oxide); (amorphous silicon/aluminum oxide); (titanium oxide/silicon oxide).

Coefficient of thermal expansion of $SiO_2$ is $4.0 \times 10^{-7}$ (1/K); coefficient of thermal expansion of $TiO_2$ is $4.0 \times 10^{-7}$ (1/K); coefficient of thermal expansion of $Al_2O_3$ is $8.0 \times 10^{-6}$ (1/K); coefficient of thermal expansion of a-Si is $3.5 \times 10^{-6}$ (1/K); coefficient of thermal expansion of ZnS is $6.8 \times 10^{-6}$ (1/K). For the purpose of reference, coefficient of thermal expansion of GaAs is $8.0 \times 10^{-7}$ (1/K).

The DBR 24 has a post structure. In a cross sectional view of the DBR 24 taken along a reference plane perpendicular to the axis, the shape of the cross section of the DBR 24 is, for example, rectangle. The shape, such as rectangle, has a boundary, and is defined by the boundary. The axis "Ax" is associated with propagation direction of light "L," and may be the optical axis of the surface emitting laser. In this embodiment, the long axis of the rectangle in the cross section is oriented to the x axis, and its short axis is oriented to the y axis. It is preferable that the ratio (A/B) of the long side "B" of the rectangle to the short side "A" be in the range of 1/1.2 to 1/5. It is also preferable that the position of the center of gravity of the rectangle be substantially equal to the position of the intersection of the axis "Ax" with the above reference plane. In another embodiment, the shape of the DBR on the reference plane is, for example, ellipse. The short axis of the ellipse corresponds to the short axis of the rectangle, and the long axis the ellipse corresponds to the long axis of the rectangle. It is also preferable that the position of the center of gravity of the ellipse be substantially equal to the position of the intersection of the axis "Ax" with the above reference plane. Further, the shape of the DBR on the above reference plane may have asymmetrical cross-section geometry.

The DBR 14 includes a reflective multiple film having semiconductor layers 14a and semiconductor layers 14b. The semiconductor layers 14a is made of, for example, n-type AlGaAs, and the semiconductor layers 14b is made of, for example, n-type GaAs. The semiconductor layers 14a and 14b are alternately arranged in the z direction.

Figure 3:
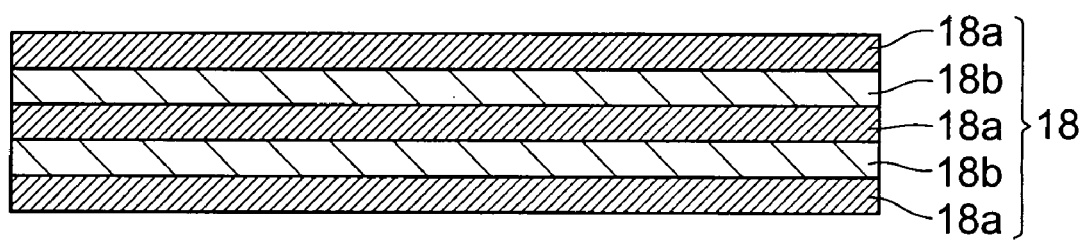
FIG. 3 is a schematic view showing an example of the active layer of the surface emitting semiconductor device.

The active layer 18 is made of III-V semiconductor material, such as InGaAs, GaInNAs, GaInNAsSb, AlGaInAs, GaInAsP and the like. The active layer may be made of bulk crystal, or may have a quantum well structure (QW). FIG. 3 is a schematic view showing an example of the active layer. The active layer 18 shown in FIG. 3 includes well layers 18a and barrier layers 18b which are arranged in the z axis to form a multiple quantum well (MQW) structure. The well layers 18a are made of, for example, InGaAs. The barrier layers 18b are made of, for example, GaAs.

In the present embodiment, the DBR 18, the active layer 18 and the DBR 24 are sequentially arranged in the direction of the axis "Ax" and are mounted on the primary surface 12a of the semiconductor substrate 12. The semiconductor substrate 12 is made of, for example, GaAs. The shape of the primary surface 12a has a geometrical symmetry, and for example, the shape of the primary surface 12a is symmetrical about a point or axis. More preferably, the shape of the primary surface 12a may be a circle or square.

A spacer layer 16 acting as a cladding is provided between the DBR 14 and the active layer 18. The spacer layer 16 made of, for example, n-type GaAs. A spacer layer 20 acting as a cladding is provided between the DBR 24 and the active layer 18. The spacer layer 20 made of, for example, p-type GaAs. The active layer 18 is provided between the spacer layer 16 and the spacer layer 20.

The surface emitting laser 10 may include a current (carrier) confinement layer 22 which has a structure to confine carriers injected to the active layer 18, and the current confinement layer 22 is provided between the spacer layer 20 and the DBR 24. The current confinement layer 22 includes a current blocking layer 22b and a filling layer 22c. The current blocking layer 22b has an opening 22a, and the filling layer 22c which is formed in the opening 22a. It is preferable that the shape of the cross section of this opening taken along a reference plane perpendicular to the axis "Ax" have axial symmetry. Preferably, the shape of the opening in the cross section is a circle or square. More preferably, the shape of the opening is a circle because the beam shape of the light "L" should be made close to a perfect circle. If this beam shape is a perfect circle, the decrease in optical coupling efficiency between the surface emitting laser and an optical fiber can be suppressed. It is preferable that the current blocking layer 22b be formed by oxidizing III-V compound semiconductor that contains aluminum as group III constituent and that the current blocking layer 22b be made of insulator, such as aluminum oxide. When the current blocking layer 22b is made of aluminum oxide, it is preferable that the filling layer 22c be made of III-V compound semiconductor that contains unoxidized aluminum atoms as group III constituent and that the filling layer 22c be made of AlAs. The resistivity of the current blocking layer 22b is larger than that of the filling layer 22c. The current confinement layer 22 may have a carrier confinement structure that includes a tunnel junction.

For example, a spacer layer 25 is provided between the current confinement layer 22 and the DBR 24, and is made of p-type GaAs, for example.

The surface emitting laser 10 includes a contact layer 26 and an electrode 28 that are arranged on the spacer 25 in turn. The contact layer 26 and electrode 28 have openings 26a and 28a, respectively, through which the light "L" propagates. If the opening 26a is formed in the contact layer 26, the light "L" is not absorbed by the contact layer 26. For example, the openings 26a and 28a may have the substantially same diameter and/or size, which are defined in the cross sections of the openings 26a and 28a taken along reference planes perpendicular to the axis "Ax." The diameters of the openings 26a and 28a are greater than the diameter of opening 22a of the current blocking layer 22b. The DBR 24 is provided in the openings 26a and 28a such that the openings 26a and 28a are filled with a part of the DBR 24. An electrode 30 is formed on the backside 12b of the semiconductor substrate 12, and the backside 12b is opposite to the primary surface 12a.

When current is injection through the electrodes 28 and 30, the light "L" is emitted from the active layer 18 through the DBR 24 to the external.

In the surface emitting laser 10, the DBR 10 includes dielectric layers 24a, and the active layer 18 are made of semiconductor. Since the dielectric layers 24a and the active layer 18 are grown at a temperature higher than room temperature, residual stress is caused in the dielectric layers 24a and the active layer 18 at room temperature depending on the difference between thermal expansion coefficients of the dielectric layers 24a and active layer, and the DBR 24 applies the stress to the active layer 18. When a semiconductor layer, such as current confinement layer, is provided between the dielectric layers 24a and the active layer 18, the DBR 24 also applies the stress to the active layer 18 through the intervening semiconductor layer. Since the shape of the DBR 24 in the cross section taken along a reference plane perpendicular to the axis "Ax" is rectangle or ellipse, the DBR 24 applies tensile or compressive stress to the active layer 18 in the direction (x direction) of the long axis or the direction (y direction) of the short axis of ellipse or rectangle. Whether or not tensile or compressive stress is applied to the active layer 18 depends on, for example, the combination of material of the dielectric layers 24a and the active layer 18.

When the active layer 18 is made of III-V compound semiconductor containing Ga and As, such as GaAs, it is preferable that the dielectric layers 24a be made of silicon oxide or titanium oxide. In the above material combination of the active layer 18 and the dielectric layers 24a, tensile stress is caused in the x direction in the active layer of the above material, and the difference between thermal expansion coefficients of the active layer 18 and the dielectric layer 24a is large.

Further, when the active layer 18 is made of III-V compound semiconductor containing Ga and As, such as GaAs, it is preferable that the dielectric layers 24a be made of aluminum oxide. In the above combination of the active layer 18 and the dielectric layers 24a, compressive stress is caused in the x direction in the active layer of the above material, and the difference between thermal expansion coefficients of the active layer 18 and the dielectric layer 24a decreases the stress in the active layer 18. Since it is hard that deterioration with time in lasing characteristics of the surface emitting laser 10 occurs, the reliability of the surface emitting laser 10 is improved. Furthermore, when the active layer 18 is made of III-V compound semiconductor containing Ga and As of constituents, such as GaAs, it is preferable that the dielectric layers 24a be made of aluminum oxide and that the dielectric layers 24b be made of amorphous silicon or ZnS. In the dielectric layers 24b made of amorphous silicon, compressive stress is caused in the x direction in the active layer of the above material. In the dielectric layers 24b made of ZnS, tensile stress is caused in the x direction in the active layer of the above material. Further, the reliability of the surface emitting laser 10 is improved.

Figure 4:
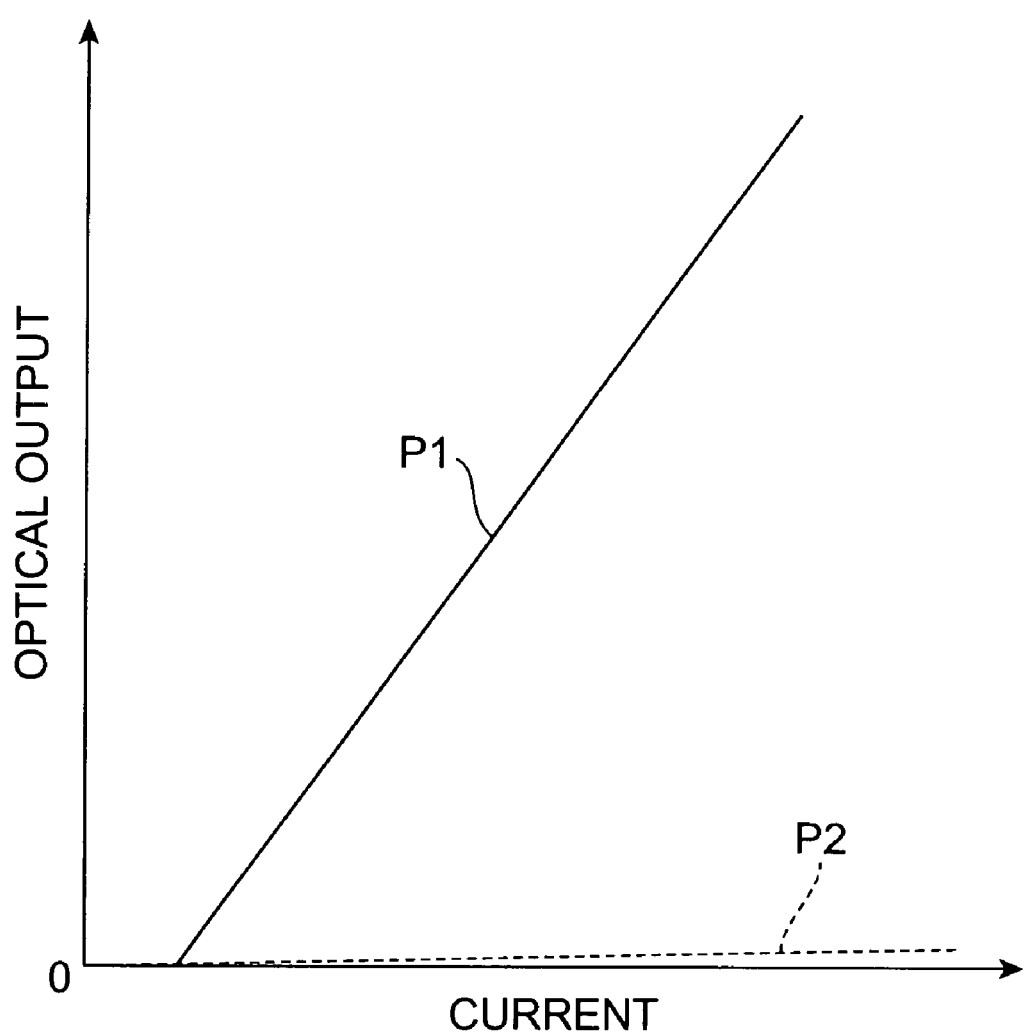
FIG. 4 is a graph showing an example of the relationship of current applied to a surface emitting laser and optical output emitted by the laser.

FIG. 4 is a graph showing an example of the relationship between the optical output power of the surface emitting laser 10 and current applied to the surface emitting laser 10. The axis of abscissas indicates the applied current and the axis of ordinate indicates the optical output power. Solid line "P1" in the graph indicates the optical output of one component of light "L" having the polarization of the y-direction. Broken line "P2" in the graph indicates the optical output of the other component of light "L" having the polarization of the x-direction. The graph reveals that the major component of light "L" has the polarization of the y-direction, which relates to the stress applied to the active layer 18. When the stress is applied to the active layer 18, the optical gains for these components of the light "L" generated by optical resonation between the DBRs 14 and 24 are different from each other. Group velocities of the optical components polarized respectively to the x- and y-directions are made different from each other due to birefringence and the optical gain difference is caused, so that the optical power "$I_y$" of the optical component having the polarization of the y-direction is much greater than the optical power "$I_x$" of the optical component having the polarization of the x-direction. The difference between the optical output power "$I_y$" and the optical output power "$I_x$" is made greater as the absolute value of stress applied to the active layer 18 is increased.

In the active layer having a quantum well structure, stress applied to the active layer 18 is increased. Therefore, the difference between the optical output power "$I_y$" and the optical output power "$I_x$" becomes greater.

As explained above, the polarization direction of light "L" can be controlled to orient it to a specific direction.

The surface emitting laser 10 can be fabricated using the following steps. First, a number of semiconductor layers are grown on the primary surface 12a of the substrate 12 by MOVPE method. These semiconductor layers are dry-etched to form a mesa structure on the substrate 12. The mesa structure includes the following semiconductor layers sequentially arranged on the substrate 12: the DBR 24; the spacer layer 16; the active layer 18; the spacer layer 20; a semiconductor layer for a current confinement layer 22 containing aluminum; the spacer layer 25; and a semiconductor layer for a contact layer 26.

Next, the side of the above semiconductor layer containing aluminum is selectively oxidized, for example, in steam atmosphere to form the current confinement layer 22. Then, the mesa structure is buried by applying resin, such as polyimide, to the substrate 12 to obtain planarization, whereby the top of the mesa structure is as approximately high as the top of the applied resin. An electrode 28 having an opening 28a is formed on the semiconductor layer for the contact layer 26. An electrode 30 is formed on the backside 12b of the semiconductor substrate 12.

Thereafter, by wet-etching the semiconductor layer for the contact layer 26, an opening 26a having the same shape as the opening 28a is formed in the contact layer 26. Next, a DBR 24 is formed using lift-off method and is filled with the openings 26a and 28a. For example, the DBR 24 is formed as follows. First, a resist film having an opening is formed on the electrode 28, and films for the DBR portion 24 is deposited in this opening and on the resist film. The cross section of the opening of the resist film, taken along a reference plane perpendicular to the normal axis of the primary surface of the substrate 12, is rectangle or circle. This shape can be formed by photolithography method using a photomask that has a pattern of, for example, rectangle or circle. Next, a lamination for the DBR 24 is formed on the resist film and in the opening. This lamination can be formed by plasma CVD method, sputtering method, EB evaporation method, ion assisted deposition method and the like. Then, the resist film is removed to form the DBR.

The above method permits the low cost fabrication of the surface emitting laser 10.

Having described the preferable embodiments according to the present invention in detail, the present invention is not limited thereto.

In the following, the present invention will be explained in detail with reference to an example, but the present invention is not limited to the specific example below.

The following epitaxial growth were sequentially performed on an n-type GaAs substrate by MOVPE method: a lower DBR having 30 pairs of n-type $Al_{0.9}Ga_{0.1}As$ layers and n-type GaAs layers; a spacer layer of n-type GaAs; an active layer having three well layers of $In_{0.2}Ga_{0.8}As$ and two barrier layers of GaAs that are alternately arranged; a spacer layer of p-type GaAs; a p-type AlAs layer; a spacer layer of p-type GaAs; a contact layer of p-type GaAs.

Subsequently, these layers were dry-etched to form a columnar mesa portion of five-micrometer height and 30-micrometer diameter on the n-type GaAs substrate. Then, the side of the p-type AlAs layer was selectively oxidized in steam atmosphere to form a current injection region (nonoxide region), and the cross section of the current injection region, taken along a reference plane perpendicular to the height direction of the mesa, has the shape of five-micrometer diameter. In order to facilitate the formation of an electrode, polyimide is applied to the substrate to obtain planarization around the mesa. The electrode was evaporated on the mesa, and another electrode was evaporated on the backside of the GaAs substrate. The electrode on the mesa has an opening of 10 micrometer diameter, and the contact layer was exposed in the opening. The contact layer was wet-etched to form an opening of five-micrometer diameter therein.

Then, an upper DBR was formed on the mesa portion by lift-off method as follows. First, resist was applied to the mesa portion to form a resist film. The exposure of the resist film was performed through a photomask having a rectangular pattern of 20 micrometers long and 10 micrometers wide, and the exposed resist film was developed to form an opening of the rectangle in the resist film. In the pattern of the photomask, the ratio of short side "A" to long side "B" (A/B) was 1/2. After the above steps, the resist mask was obtained and had the opening of the rectangle, the short and long sides of which were 10 micrometers and 20 micrometers, respectively, and the center of gravity of which was on the center of the top surface of the mesa.

Next, five pairs of amorphous silicon layers and $Al_2O_3$ layers were grown on the resist film and in the opening at the temperature of 230 degrees Celsius by ion-assisted evaporation method. The thickness of each amorphous silicon layer was 84.1 nm, and the thickness of each $Al_2O_3$ layer was 163.6 nm. Subsequently, the resist film was removed to form the upper DBR on the mesa.

The center wavelength in the spectrum of the upper DBR was 1060 nm. The same upper DBR was formed directly on a GaAs substrate to prepare a device for estimating the reflectivity of the upper DBR. The reflectivity of this device was measured by introducing light from the air to the upper DBR, and the reflectivity was 99.85%. The cross section of the upper DBR, taken along a reference plane perpendicular to the optical axis of the laser beam from the surface emitting laser, was rectangle having the ratio of short side "A" to long side "B" (A/B) of 1/2. The polarization of the primary component of the laser beam emitted from the surface emitting laser was directed to the short axis of the rectangle. Since the pattern of the laser beam was a perfect circle, this beam pattern was able to prevent the decrease in the optical coupling efficiency between the laser and an optical fiber.

In the mask having a pattern of an rectangle, when the ratio of short side "A" to long side "B" (A/B) of the rectangle was 1/1.2 or 1/5, then the polarization of the dominant component of the laser beam emitted from the surface emitting laser was directed to the short side axis of the rectangle.

In the mask having a pattern of an ellipse, when the ratio of short axis "A" to long axis "B" (A/B) of the ellipse was 1/2, 1/1.2 or 1/5, then the polarization direction of the dominant component of the laser beam emitted from the surface emitting laser was directed to the short side axis of the ellipse.

Further, by use of sputtering method using ECR plasma film forming apparatus in place of ion-assisted evaporation method, five pairs of amorphous silicon layers and $Al_2O_3$ layers were grown on the resist film at the temperature of 150 degrees Celsius. The polarization of the primary component of the laser beam emitted from the surface emitting laser was directed to the short side axis of the rectangle and the short axis of the ellipse.

Furthermore, when four pairs of amorphous silicon layers and $SiO_2$ layers were grown in place of the five pairs of amorphous silicon layers and $Al_2O_3$ layers, the polarization of the dominant component of the laser beam emitted from the surface emitting laser was directed to the short side axis of the rectangle and ellipse. The thickness of each amorphous silicon layer was 84.1 nm, and the thickness of each $SiO_2$ layer was 179.1 nm. Since the difference between the thermal expansion coefficient of $SiO_2$ ($4.0 \times 10^{-7}$ 1/K) and the thermal expansion coefficient of GaAs ($6.8 \times 10^{-6}$ 1/K) is large, stress to the active layer is varied with temperature. The optical power of the component having the short-axis polarization is increased.

When seven pairs of $Al_2O_3$ layers and $TiO_2$ layers were grown in place of the five pairs of amorphous silicon layers and $Al_2O_3$ layers, the polarization of the dominant component of the laser beam emitted from the surface emitting laser was directed to the short side axis of the rectangle and ellipse. The thickness of each $TiO_2$ layer was 105.2 nm, and the thickness of each $Al_2O_3$ layer was 163.6 nm. Since the difference between the thermal expansion coefficient of $TiO_2$ ($4.0 \times 10^{-7}$ 1/K) and the thermal expansion coefficient of GaAs (6.8× $10^{-6}$ 1/K) is large, stress to the active layer is varied with temperature. The optical power of the component of the short-axis polarization is increased.

When six pairs of ZnS layers and $Al_2O_3$ layers were grown in place of the five pairs of amorphous silicon layers and $Al_2O_3$ layers, the polarization of the dominant component of the laser beam emitted from the surface emitting laser was directed to the long side axis of the rectangle and ellipse. The thickness of each ZnS layer was 115.62 nm, and the thickness of each $Al_2O_3$ layer was 163.6 nm. Since the difference between the thermal expansion coefficient of ZnS ($6.8\times10^{-6}$ 1/K) and the thermal expansion coefficient of GaAs (6.8× $10^{-6}$ 1/K) is substantially equal to each other, the variation with time in the characteristics of the surface emitting laser is hardly caused.

Having described and illustrated the embodiments of the semiconductor optical amplifiers according to the invention, the application of the present invention is not limited thereto. Details of structures of these devices can be modified as necessary. We therefore claim all modifications and variations coming within the spirit and scope of the following claims.

What is claimed is:

1. A surface emitting semiconductor device comprising:
   a semiconductor region including an active layer, a first surface and a second surface, the first surface being opposite to the second surface, and the first surface, the active layer and the second surface being arranged in a direction of a predetermined axis;
   a first distributed Bragg reflector including first layers and second layers, the first layers and second layers being alternately arranged in the direction of the predetermined axis, the first distributed Bragg reflector having a top surface and a bottom surface, the top surface and the bottom surface being arranged in the direction of the predetermined axis, the bottom surface of the first distributed Bragg reflector being in physical contact with the first surface, a shape of the bottom surface of the first distributed Bragg reflector being different from a shape of the first surface, and the first layers being made of dielectric material; and
   a second distributed Bragg reflector, the first distributed Bragg reflector, the semiconductor region and the second distributed Bragg reflector being sequentially arranged along the predetermined axis;
   wherein a cross section of the first distributed Bragg reflector is taken along a reference plane perpendicular to the predetermined axis, a distance between two points on an edge of the cross section takes a first value in a direction of an X-axis of a two-dimensional XY orthogonal coordinate system defined on the reference plane, a distance between two points on the edge takes a second value in a direction of a Y-axis of the two-dimensional XY orthogonal coordinate system, the first value is different from the second value, a cross section of the second distributed Bragg reflector is taken along another reference plane perpendicular to the predetermined axis, and a shape of the cross section of the first distributed Bragg reflector is different from a shape of the cross section of the second distributed Bragg reflector, wherein
   the shape of the bottom surface of the first distributed Bragg reflector has an asymmetrical cross-section geometry by reference to an optical axis of the surface emitting semiconductor device, and
   the first distributed Bragg reflector applies stress to the active layer through the bottom surface, the direction of the stress is associated with the asymmetrical cross-section geometry, and the stress is one of tensile stress and compressive stress.

2. The surface emitting semiconductor device according to claim 1, wherein the first value is maximum.

3. The surface emitting semiconductor device according to claim 1, wherein the second value is maximum.

4. The surface emitting semiconductor device according to claim 1, wherein the shape of the cross section of the first distributed Bragg reflector is rectangular.

5. The surface emitting semiconductor device according to claim 1, wherein the shape of the cross section of the first distributed Bragg reflector is elliptic.

6. The surface emitting semiconductor device according to claim 1, wherein the active layer has a quantum well structure.

7. The surface emitting semiconductor device according to claim 1, wherein the first surface has a first area and a second area, and the first distributed Bragg reflector is provided on the first area.

8. The surface emitting semiconductor device according to claim 7, wherein the first distributed Bragg reflector is in contact with the first area.

9. The surface emitting semiconductor device according to claim 1, wherein the second distributed Bragg reflector includes a plurality of semiconductor layers.

10. The surface emitting semiconductor device according to claim 1, wherein the first distributed Bragg reflector applies tensile stress to the active layer.

11. The surface emitting semiconductor device according to claim 1, wherein the first distributed Bragg reflector applies compressive stress to the active layer.

12. The surface emitting semiconductor device according to claim 1, wherein the semiconductor region includes a current confinement layer provided between the active layer and the first distributed Bragg reflector, the current confinement layer includes a current blocking layer and a filling layer, the current blocking layer has an opening, and the filling layer is provided in the opening.

13. The surface emitting semiconductor device according to claim 1, wherein the semiconductor region includes a current confinement layer provided between the active layer and the first distributed Bragg reflector, the current confinement layer includes a carrier confinement structure having a tunnel junction.

14. The surface emitting semiconductor device according to claim 1, further comprising:
   a conductive substrate having a first surface and second surface, the first surface being opposite to the second surface, and
   a first electrode in direct contact with the second surface,
   wherein the semiconductor region has a mesa, the mesa is provided on the first surface of the conductive substrate, and the mesa includes a contact layer, the active layer and the second distributed Bragg reflector sequentially arranged along the predetermined axis.

15. The surface emitting semiconductor device according to claim 1, wherein the surface emitting semiconductor device includes a laser diode and the laser diode emits a polarized laser beam.

16. The surface emitting semiconductor device according to claim 1, wherein the first and second layers are made of silicon oxide and amorphous silicon, respectively.

17. The surface emitting semiconductor device according to claim 1, wherein the first and second layers are made of $Al_2O_3$ and $TiO_2$, respectively.

18. The surface emitting semiconductor device according to claim 1, wherein the first and second layers are made of $Al_2O_3$ and ZnS, respectively.

19. The surface emitting semiconductor device according to claim 1,
   wherein the shape of the bottom surface of the first distributed Bragg reflector is one of a rectangle and an ellipse.

20. The surface emitting semiconductor device according to claim 1, further comprising an electrode in direct contact with the first surface.

* * * * *